(12) United States Patent
Dong et al.

(10) Patent No.: US 11,735,235 B2
(45) Date of Patent: *Aug. 22, 2023

(54) SERIES OF PARALLEL SENSING OPERATIONS FOR MULTI-LEVEL CELLS

(71) Applicant: Taiwan Semiconductor Manufacturing Company, Ltd., Hsinchu (TW)

(72) Inventors: Qing Dong, Hsinchu (TW); Mahmut Sinangil, Campbell, CA (US); Yen-Ting Lin, San Jose, CA (US); Kerem Akarvardar, Hsinchu (TW); Carlos H. Diaz, Los Altos Hills, CA (US); Yih Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/571,077

(22) Filed: Jan. 7, 2022

(65) Prior Publication Data
US 2022/0130435 A1   Apr. 28, 2022

Related U.S. Application Data

(63) Continuation of application No. 16/901,990, filed on Jun. 15, 2020, now Pat. No. 11,238,906.

(51) Int. Cl.
*G11C 7/06*   (2006.01)
*G11C 7/14*   (2006.01)
(Continued)

(52) U.S. Cl.
CPC .................. *G11C 7/08* (2013.01); *G11C 5/06* (2013.01); *G11C 7/1012* (2013.01); *G11C 16/26* (2013.01);
(Continued)

(58) Field of Classification Search
CPC ........... G11C 7/08; G11C 5/06; G11C 7/1012; G11C 16/26
(Continued)

(56) References Cited

U.S. PATENT DOCUMENTS 5,438,546 A   8/1995 Ishac et al.
9,147,449 B2 * 9/2015 Wang .................. G11C 13/0004
(Continued)

FOREIGN PATENT DOCUMENTS

EP   0 997 913   5/2000
EP   1 387 361   2/2004
(Continued)

*Primary Examiner* — Ly D Pham
(74) *Attorney, Agent, or Firm* — Foley & Lardner LLP

(57) ABSTRACT

Disclosed herein are related to a circuit and a method of reading or sensing multiple bits of data stored by a multi-level cell. In one aspect, a first reference circuit is selected from a first set of reference circuits, and a second reference circuit is selected from a second set of reference circuits. Based at least in part on the first reference circuit and the second reference circuit, one or more bits of multiple bits of data stored by a multi-level cell can be determined. According to the determined one or more bits, a third reference circuit from the first set of reference circuits and a fourth reference circuit from the second set of reference circuits can be selected. Based at least in part on the third reference circuit and the fourth reference circuit, additional one or more bits of the multiple bits of data stored by the multi-level cell can be determined.

20 Claims, 5 Drawing Sheets

(51) Int. Cl.
  *G11C 11/56* (2006.01)
  *G11C 7/08* (2006.01)
  *G11C 7/10* (2006.01)
  *G11C 16/26* (2006.01)
  *G11C 5/06* (2006.01)
  *G11C 13/00* (2006.01)

(52) U.S. Cl.
  CPC .............. *G11C 7/14* (2013.01); *G11C 13/004* (2013.01); *G11C 2013/0054* (2013.01)

(58) Field of Classification Search
  USPC .................................................... 365/189.02
  See application file for complete search history.

(56) References Cited

U.S. PATENT DOCUMENTS

| | | | |
|---|---|---|---|
| 11,238,906 B2* | 2/2022 | Dong | G11C 7/1012 |
| 2007/0147113 A1 | 6/2007 | Mokhlesi et al. | |
| 2007/0171744 A1 | 7/2007 | Mokhlesi et al. | |
| 2008/0219072 A1 | 9/2008 | Breen et al. | |
| 2009/0237976 A1 | 9/2009 | Zhang | |
| 2015/0187394 A1* | 7/2015 | Lee | G11C 7/065 365/207 |

FOREIGN PATENT DOCUMENTS

| | | |
|---|---|---|
| EP | 1 467 377 | 10/2004 |
| EP | 3 496 102 | 6/2019 |

* cited by examiner

400

Perform a first parallel sensing through sense amplifiers with reference circuits during a first time period
410

Select reference circuits, each associated with a corresponding one of multiplexers
412

Determine one or more bits of multiple bits of data stored by memory cell according to the reference circuits
414

Perform a second parallel sensing through the sense amplifiers with different reference circuits during a second time period
430

Select different reference circuits, according to the determined one or more bits
432

Determine additional one or more bits of the multiple bits of data stored by the memory cell according to the different reference circuits
434

FIG. 4

SERIES OF PARALLEL SENSING OPERATIONS FOR MULTI-LEVEL CELLS

CROSS-REFERENCE TO RELATED APPLICATION

This application is a continuation of U.S. patent application Ser. No. 16/901,990 filed on Jun. 15, 2020, which is incorporated by reference herein in its entirety.

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided but may lose the stored data once the power is shut off. Unlike volatile memory devices, non-volatile memory devices may retain data even after the power is shut off but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a flowchart of a method of reading multiple bits of data stored by a multi-level cell, in accordance with some embodiments.

DETAILED DESCRIPTION

Figure 1:
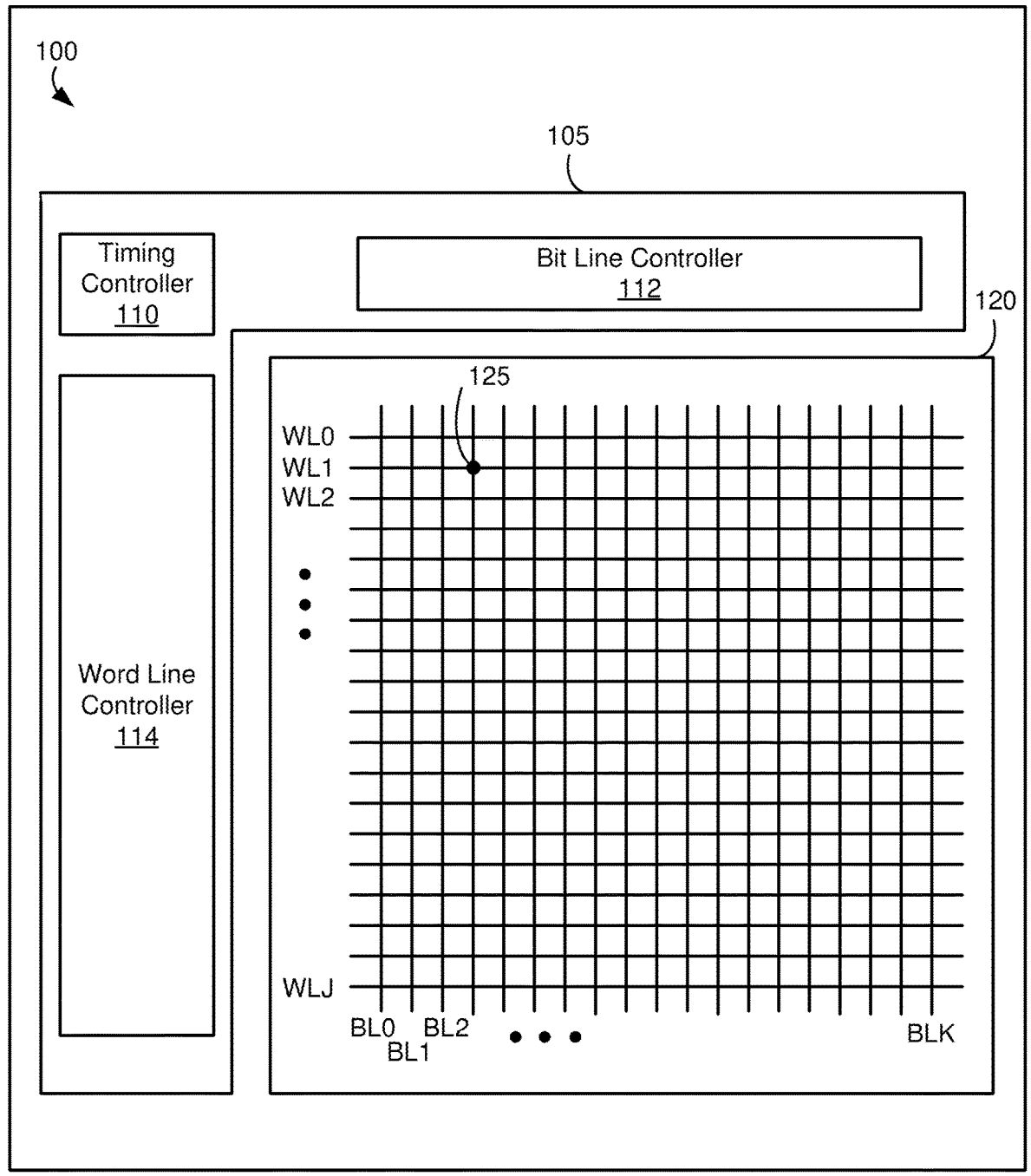
FIG. 1 is a diagram of a memory device including multi-level cells, in accordance with one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, data stored by a multi-level cell (MLC) is read through a series of parallel sensing operations. In one aspect, a first parallel sensing operation is performed through two or more sense amplifiers to determine a first bit of multiple bits of data stored by the MLC. For example, a first reference circuit is selected from a first set of reference circuits, and a second reference circuit is selected from a second set of reference circuits to determine one or more bits (e.g., most significant bits (MSBs)) of the multiple bits of data stored by the MLC. According to the determined one or more bits, a second parallel sensing operation can be performed through the two or more sense amplifiers. For example, a third reference circuit from the first set of reference circuits and a fourth reference circuit from the second set of reference circuits can be selected. Based at least in part on the third reference circuit and the fourth reference circuit, additional one or more bits (e.g., least significant bits (LSBs)) of the multiple bits of data stored by the multi-level cell can be determined.

Advantageously, the series of parallel sensing operations disclosed herein allows sensing multiple bits of data stored by an MLC in an area and time efficient manner. For example, serial sensing through a single sense amplifier allows reduction in an area of the integrated circuit but may take a long time. Meanwhile, parallel sensing through multiple sense amplifiers allows sensing in a time efficient manner, but multiple sense amplifiers may consume a large area of the integrated circuit. By determining one or more bits (e.g., MSBs) of multiple bits of data stored by the MLC through a first parallel sensing operation and one or more bits (e.g., LSBs) of the multiples bits of data stored by the MLC through a second parallel sensing operation based on the first parallel sensing operation, less number of comparators can be implemented compared to a number of comparators for performing a single parallel sensing operation. Moreover, a speed of comparison can be improved compared to a speed of comparison for performing a serial sensing operation. Hence, multiple bits of data stored by the MLC can be read in an area and time efficient manner.

FIG. 1 is a diagram of a memory device 100, in accordance with one embodiment. In some embodiments, the memory device 100 includes a memory controller 105 and a memory array 120. The memory array 120 may include a plurality of storage units or storage circuits 125 arranged in two or three dimensional arrays. Each storage circuit may be coupled to a corresponding word line WL and a corresponding bit line BL. The memory controller 105 may write data to or read data from the memory array 120 according to electrical signals through word lines WL and bit lines BL. In other embodiments, the memory device 100 includes more, fewer, or different components than shown in FIG. 1.

The memory array 120 is a hardware component that stores data. In one aspect, the memory array 120 is embodied as a semiconductor memory device. The memory array 120 includes a plurality of storage units or storage circuits 125. The memory array 120 includes word lines WL0, WL1 ... WLJ, each extending in a first direction (e.g., X-direction) and bit lines BL0, BL1 ... BLK, each extending in a second direction (e.g., Y-direction). The word lines WL and the bit lines BL may be conductive metals or conductive rails. In one aspect, each storage circuit 125 is coupled to a corresponding word line WL and a corresponding bit line BL, and can be operated according to voltages or currents through the corresponding word line WL and the corresponding bit line BL. In one aspect, each storage circuit 125 includes a MLC. An MLC is a single memory cell capable of storing multiple bits of data. Examples of the storage circuit 125 include a volatile memory cell such as a phase change random access memory (PCRAM) cell, a resistive random access memory (RRAM) cell, or any memory cell that stores multiple bits of data. In some embodiments, the memory array 120 includes additional lines (e.g., select lines, reference lines, reference control lines, power rails, etc.). Detailed descriptions on configurations and operations of memory device 100 are provided below with respect to FIGS. 2 through 5.

The memory controller 105 is a hardware component that controls operations of the memory array 120. In some embodiments, the memory array 120 includes a bit line controller 112, a word line controller 114, and a timing controller 110. In one configuration, the word line controller 114 is a circuit that provides a voltage or a current through one or more word lines WL of the memory array 120, and the bit line controller 112 is a circuit that provides or senses a voltage or current through one or more bit lines BL of the memory array 120. In one configuration, the timing controller 110 is a circuit that provides control signals or clock signals to synchronize operations of the bit line controller 112 and the word line controller 114. The bit line controller 112 may be coupled to bit lines BL of the memory array 120, and the word line controller 114 may be coupled to word lines WL of the memory array 120. In one example, to write data to a storage circuit 125, the word line controller 114 provides a voltage or current to the storage circuit 125 through a word line WL coupled to the storage circuit 125 and applies a bias voltage to the storage circuit 125 through a bit line BL coupled to the storage circuit 125. In one example, to read data from a storage circuit 125, the word line controller 114 provides a voltage or current to the storage circuit 125 through a word line WL coupled to the storage circuit 125 and senses a voltage or current corresponding to data stored by the storage circuit 125 through a bit line BL coupled to the storage circuit 125. In some embodiments, the memory controller 105 includes more, fewer, or different components than shown in FIG. 1.

Figure 2:
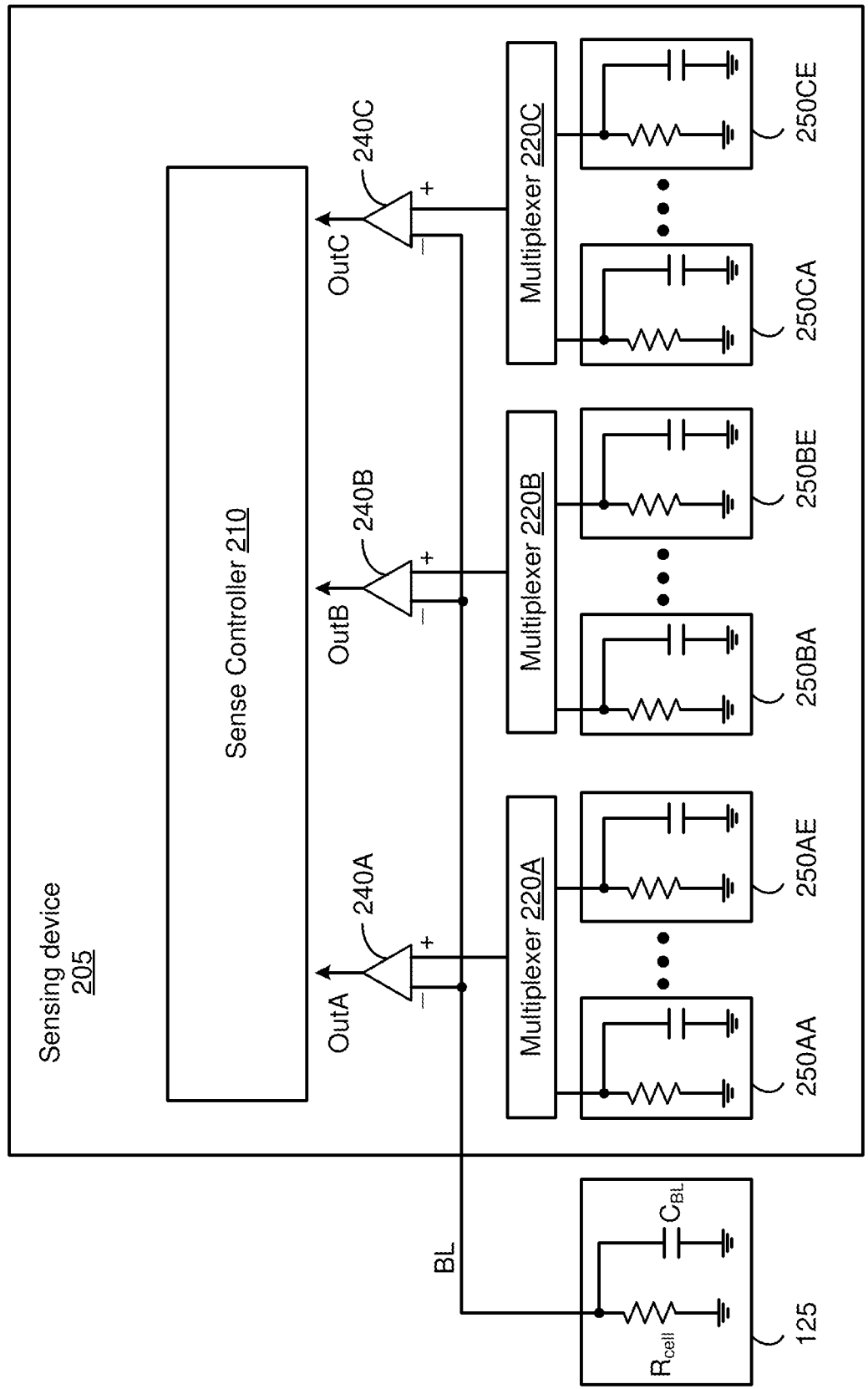
FIG. 2 is a diagram of a sense device that performs a series of parallel sensing operations, in accordance with some embodiments.

FIG. 2 is a diagram of a sensing device 205 that performs a series of parallel sensing operations, in accordance with some embodiments. In some embodiments, the sensing device 205 is part of the bit line controller 112 of FIG. 1. In some embodiments, the sensing device 205 includes a sense controller 210, sense amplifiers 240A-240C, multiplexers 220A-220C, and reference circuits 250AA . . . 250AE, 250BA . . . 250BE, 250CA . . . 250CE. In one aspect, these components operate together to perform a series of parallel sensing operations to read data from the storage circuit 125 (also referred to as "an MLC 125" herein). In other embodiments, the sensing device 205 includes more, fewer, or different components than shown in FIG. 2. For example, in some embodiments, the sensing device 205 includes more or different number of sense amplifiers 240, multiplexers 220, and reference circuits 250 than shown in FIG. 2.

In some embodiments, each reference circuit 250 is a circuit that provides a corresponding reference characteristic. An example characteristic includes a discharge rate, a resistance, a voltage, etc. In some embodiments, the reference circuits 250 can be replaced by other components that perform similar functions of the reference circuits 250. In one aspect, a characteristic (a discharge rate, a resistance, a voltage, etc.) of the MLC 125 can be set, programmed or configured, from a plurality of predetermined resistances, according to multiple bits of data stored. For example, a resistance of a memory cell between a reference resistance $0^{th} R_{ref}$ (e.g., 400Ω) and a reference resistance $1^{th} R_{ref}$ (e.g., 4 kΩ) represents [0001], a resistance of the memory cell between the reference resistance $1^{th} R_{ref}$ (e.g., 4 kΩ) and a reference resistance $2^{nd} R_{ref}$ (e.g., 40 kΩ) represents [0011], and a resistance of the memory cell between the reference resistance $2^{nd} R_{ref}$ (e.g., 40 kΩ) and a reference resistance $3^{rd} R_{ref}$ (e.g., 400 kΩ) represents [0011]. In some embodiments, the reference circuits 250 are set, designed or implemented with different values of reference characteristics that can be compared against the programmed characteristic of the MLC 125 to determine multiple bits of data stored by the MLC 125. In one some embodiments, each of the reference circuits 250AA . . . 250AE, 250BA . . . 250BE, 250CA . . . 250CE has a corresponding one of reference resistances $0^{th} R_{ref}$ . . . $14^{th} R_{ref}$ that can be used to identify or distinguish 16 values of 4 bit data. The reference resistances $0^{th} R_{ref}$ . . . $14^{th} R_{ref}$ may monotonically (linearly or non-linearly) increase in that sequence. In one aspect, the reference circuits 250AA . . . 250AE, 250BA . . . 250BE, 250CA . . . 250CE have non-monotonically assigned reference resistances to allow efficient parallel sensing. In one configuration, the reference circuits 250AA . . . 250AE have reference resistances $3^{rd} R_{ref}$, $0^{th} R_{ref}$, $4^{th} R_{ref}$, $8^{th} R_{ref}$, $12^{th} R_{ref}$, respectively; the reference circuits 250BA . . . 250BE have reference resistances $7^{th} R_{ref}$, $1^{st} R_{ref}$, 5th $R_{ref}$, 9th $R_{ref}$, $13^{th} R_{ref}$, respectively; and the reference circuits 250CA . . . 250CE have reference resistances $11^{th} R_{ref}$, $2^{nd} R_{ref}$, $6^{th} R_{ref}$, $10^{th} R_{ref}$, $14^{th} R_{ref}$, respectively. Such arrangement of resistances allows efficient parallel sensing operations, as described below with respect to FIG. 3.

In some embodiments, each multiplexer 220 is a circuit that electrically couples, from a corresponding subset of reference circuits 250, a selected reference circuit to a corresponding sense amplifier 240. In other embodiments, the multiplexers 220 can be replaced by other components that perform similar functions of the multiplexers 220. In one configuration, the multiplexer 220A includes input ports coupled to a subset of reference circuits 250AA . . . 250AE, and an output port coupled to an input port of the sense amplifier 240A. In addition, the multiplexer 220B includes input ports coupled to a subset of reference circuits 250BA . . . 250BE, and an output port coupled to an input port of the sense amplifier 240B. In addition, the multiplexer 220C includes input ports coupled to a subset of reference circuits 250CA . . . 250CE, and an output port coupled to an input port of the sense amplifier 240C. Moreover, each of the multiplexers 220A-220C includes a control port coupled to the sense controller 210 to receive a control signal from the sense controller 210. In this configuration, each of the multiplexers 220A-220C may electrically couple, from a corresponding subset of reference circuits 250, a selected reference circuit to a corresponding sense amplifier 240 according to a control signal from the sense controller 210. For example, the multiplexer 220A electrically couples the reference circuit 250AA to the sense amplifier 240A, while the multiplexer 220B electrically couples the reference circuit 250BA to the sense amplifier 240B and the multiplexer 220C electrically couples the reference circuit 250CA to the sense amplifier 240C. When the multiplexer 220 electrically couples, from a subset of reference circuits, a selected reference circuit to a corresponding sense amplifier, the remaining reference circuits of the subset of the reference circuits may be electrically decoupled from the corresponding sense amplifier. Hence, a voltage, current, or resistance at the selected sense amplifier can be provided to the corresponding sense amplifier, while voltages, currents, or resistances at the remaining sense amplifiers may not be provided to the corresponding sense amplifier.

In some embodiments, each sense amplifier 240 is a circuit that compares a characteristic of the MLC 125 with a reference characteristic of a selected reference circuit 250 through a corresponding multiplexer 220. In other embodiments, the sense amplifier 240 can be replaced by other components that perform similar functions of the sense amplifiers 240. In one configuration, each sense amplifier includes a first input port (e.g., shown as "−") coupled to the MLC 125 through the bit line BL, a second input port (e.g., shown as "+") coupled to a corresponding multiplexer 220, and an output port coupled to the sense controller 210. In one configuration, a sense amplifier 240 compares a discharge rate of a MLC 125 with a discharge rate of the selected reference circuit 250. In one aspect, the MLC 125 can be modeled as a resistor $R_{cell}$ with a capacitor CBL corresponding to a capacitance of the bit line BL. In one example, a voltage of the MLC 125 at the bit line BL can decrease at a rate corresponding to the resistance $R_{cell}$ set or programmed. Similarly, a voltage of the selected reference circuit 250 can decrease at a rate corresponding to a predetermined resistance of the selected reference circuit 250. In one approach, the sense controller 210 may charge or set the MLC 125 and the selected reference circuit 250 to have the same voltage. After a predetermined time period (e.g., 10 ns), a voltage of the MLC 125 at the bit line BL and a voltage of the selected reference circuit 250 may differ, because the MLC 125 and the selected reference circuit 250 have different discharge rates. After the predetermined time period, the sense amplifier 240 may detect a difference in a voltage of the MLC 125 at the bit line BL and a voltage of the selected reference circuit 250 and generate an output signal according to the detected difference. For example, in response to a voltage (e.g., 400 mV) of the MLC 125 being higher than a voltage (e.g., 300 mV) of the selected reference circuit 250, the MLC 125 may generate an output signal having 0V or logic [0]. Conversely, in response to a voltage (e.g., 300 mV) of the MLC 125 being lower than a voltage (e.g., 400 mV) of the selected reference circuit 250, the MLC 125 may generate an output signal having VDD or logic value [1].

In some embodiments, the sense controller 210 is a circuit that configures one or more components of the sensing device 205 to perform a series of parallel sensing operations to determine multiple bits of data stored by the MLC 125 according to outputs from the sense amplifiers 240A-240C. The sense controller 210 may be embodied as a digital logic circuit or a state machine. In other embodiments, the sense controller 210 can be replaced by other components that perform similar functions of the sense controller 210. In one configuration, the sense controller 210 includes input ports coupled to outputs ports OutA, OutB, OutC of the sense amplifiers 240A-240C. In addition, the sense controller 210 includes one or more output ports coupled to control ports of the multiplexers 220A-220C to provide control signals for one or more reference circuits 250. In this configuration, the sense controller 210 can perform a first parallel sensing operation through the sense amplifiers 240A-240C to determine a value (or values) of one or more bits (e.g., MSB) of multiple bits of data stored by the MLC 125. In addition, the sense controller 210 can perform a second parallel sensing operation through the sense amplifiers 240A-240C based at least in part on the one or more bits (e.g., MSB) of the multiple bits of data determined by the first parallel sensing operation to determine a value (or values) of one or more bits (e.g., LSB) of multiple bits of data stored by the MLC 125. Assuming for an example that the MLC 125 can store 4 bit data [YYXX], the sense controller 210 may perform the first parallel sensing through the sense amplifier 240A-240C to determine values of the two MSBs [YY]. Then, according to the MSBs [YY], the sense controller 210 may perform the second parallel sensing through the sense amplifier 240A-240C to determine values of the two LSBs [XX].

In some embodiments, to perform a parallel sensing operation, the sense controller 210 may configure each of the multiplexers 220A-220C to select a predetermined reference circuit from a corresponding subset of reference circuits 250, and determine one or more bits (e.g., MSB) of data stored by the MLC 125 according to the selected reference circuits. In one approach, the sense controller 210 configures the multiplexer 220A-220C to select the reference circuits 250AA, 250BA, 250CA having predetermined or pre-assigned reference resistances (e.g., $3^{rd}$ $R_{ref}$, $7^{th}$ $R_{ref}$, $11^{th}$ $R_{ref}$) for determining the one or more bits (e.g., MSBs). In one example, the reference resistances $3^{rd}$ $R_{ref}$, $7^{th}$ $R_{ref}$, $11^{th}$ $R_{ref}$ are predetermined or assigned for determining first two bits of multiple bits (e.g., [YY] of [YYXX]). For example, the MLC 125 storing any of [0000], [0001], [0010], [0011] has a resistance lower than the reference resistance $3^{rd}$ $R_{ref}$; the MLC 125 storing any of [0100], [0101], [0110], [0111] has a resistance between the reference resistance $3^{rd}$ $R_{ref}$ and the reference resistance $7^{th}$ $R_{ref}$; the MLC 125 storing any of [1000], [1001], [1010], [1011] has a resistance between the reference resistance $7^{rd}$ $R_{ref}$ and the reference resistance $11^{th}$ $R_{ref}$; and the MLC 125 storing any of [1100], [1101], [1110], [1111] has a resistance greater than the reference resistance $11^{rd}$ $R_{ref}$. During the first time period, the sense amplifiers 240A, 240B, 240C may compare characteristic (e.g., discharge rate) of the MLC 125 with characteristic (e.g., discharge rates) of the selected reference circuits (e.g., 250AA, 250BA, 250CA), and determine a value (or values) of one or more bits (e.g., MSB) of multiple bits of data stored by the MLC 125 according to the comparison.

In one example, a discharge rate less than a discharge rate of the reference circuit 250AA corresponds to [00XX] of data stored by the MLC 125; a discharge rate between i) the discharge rate of the reference circuit 250AA having the reference resistance $3^{rd}$ $R_{ref}$ and ii) a discharge rate of the reference circuit 250BA having the reference resistance $7^{th}$ $R_{ref}$ corresponds to [01XX] of data stored by the MLC 125; a discharge rate between i) the discharge rate of the reference circuit 250BA and ii) a discharge rate of the reference circuit 250CA having the reference resistance $11^{th}$ $R_{ref}$ corresponds to [10XX] of data stored by the MLC 125; and a discharge rate higher than the discharge rate of the reference circuit 250CA corresponds to [11XX] of data stored by the MLC 125. In this example, the sense controller 210 can determine first two MSBs according to outputs OutA, OutB, OutC from the sense amplifiers 240A-240C. For example, if the outputs OutA, OutB, OutC are [110] in a thermometer code (corresponding to '2' in a decimal representation as indicated a number of '1'), the sense controller 210 may determine that a discharge rate of the MLC 125 is higher than discharge rates of the reference circuits 250AA, 250BA but less than the discharge rate of the reference circuit 250CA. Accordingly, the sense controller 210 may determine that first two MSBs of the MLC 125 is [10] in a binary code (corresponding to '2' in the decimal representation).

In some embodiments, to perform a subsequent parallel sensing, the sense controller 210 may select, from each of different sets of reference circuits, a reference circuit according to the determined one or more bits through the prior parallel sensing, and cause the multiplexers 220A-220C to electrically couple the selected reference circuits to corresponding sense amplifiers 240A-240C during a second time period. For example, in response to [00] of two bits determined during the prior sensing, the reference circuits 250AB, 250BB, 250CB having resistances $0^{th}$ $R_{ref}$, $1^{st}$ $R_{ref}$, $2^{nd}$ $R_{ref}$ respectively, are selected to determine values of subsequent two bits [XX] from [00XX]; in response to [01] of two bits determined during the prior sensing, the reference circuits 250AC, 250BC, 250CC having resistances $4^{th}$ $R_{ref}$, $5^{th}$ $R_{ref}$, $6^{th}$ $R_{ref}$ respectively, are selected to determine subsequent two bits [XX] from [01XX]; in response to [10] of two bits determined during the prior sensing, the reference circuits 250AD, 250BD, 250CD having resistances $8^{th}$ $R_{ref}$, $9^{th}$ $R_{ref}$, $10^{th}$ $R_{ref}$ respectively, are selected to determine subsequent two bits [XX] from [10XX]; and in response to [11] of two bits determined during the prior sensing, the reference circuits 250AE, 250BE, 250CE having reference resistances $12^{th}$ $R_{ref}$, $13^{th}$ $R_{ref}$, $14^{th}$ $R_{ref}$ respectively, are selected, to determine subsequent two bits [XX] from [11XX]. Assuming for an example that two bits determined through the prior parallel sensing is [10], the sense controller 210 selects the reference circuits 250AD, 250BD, 250CD having reference resistances $8^{th}$ $R_{ref}$, 9th $R_{ref}$, $10^{th}$ $R_{ref}$ associated with [10] for determining subsequent bits [XX] of [10XX]. Then, the sense controller 210 generates one or more control signals to configure the multiplexers 220A, 220B, 220C to electrically couple the selected reference circuits 250AD, 250BD, 250CD to the sense amplifiers 240A, 240B, 240C, respectively, during the second time period. The sense amplifiers 240A-240C may compare characteristics of selected reference circuits with the characteristic of the MLC 125 during the second time period. The sense controller 210 may determine one or more bits (e.g., LSB) of multiple bits of data stored by the MLC 125 according to outputs from the sense amplifiers 240A-240C during the second time period in a similar manner as determining the one or more bits (e.g., MSB) of the multiple bits of data.

Advantageously, the series of parallel sensing operations disclosed herein allows sensing multiple bits of data stored by a MLC 125 in an area and time efficient manner. For example, serial sensing through a single sense amplifier allows reduction in an area of the integrated circuit but may take a long time. Meanwhile, parallel sensing through multiple sense amplifiers allows sensing in a time efficient manner, but multiple sense amplifiers may consume a large area of the integrated circuit. By determining a value (or values) of one or more bits (e.g., MSBs) of multiple bits (e.g., [YY] of [YYXX]) of data stored by the MLC 125 through a first parallel sensing operation and determining one or more bits (e.g., LSBs) of the multiples bits (e.g., [XX] of [YYXX]) of data stored by the MLC 125 through a second parallel sensing operation based on the first parallel sensing operation, less number of comparators can be implemented compared to a number of comparators for performing a single parallel sensing operation. Moreover, a speed of comparison can be improved compared to a speed of comparison for performing a serial sensing operation. Hence, multiple bits of data stored by the MLC can be read in an area and time efficient manner.

Figure 3:
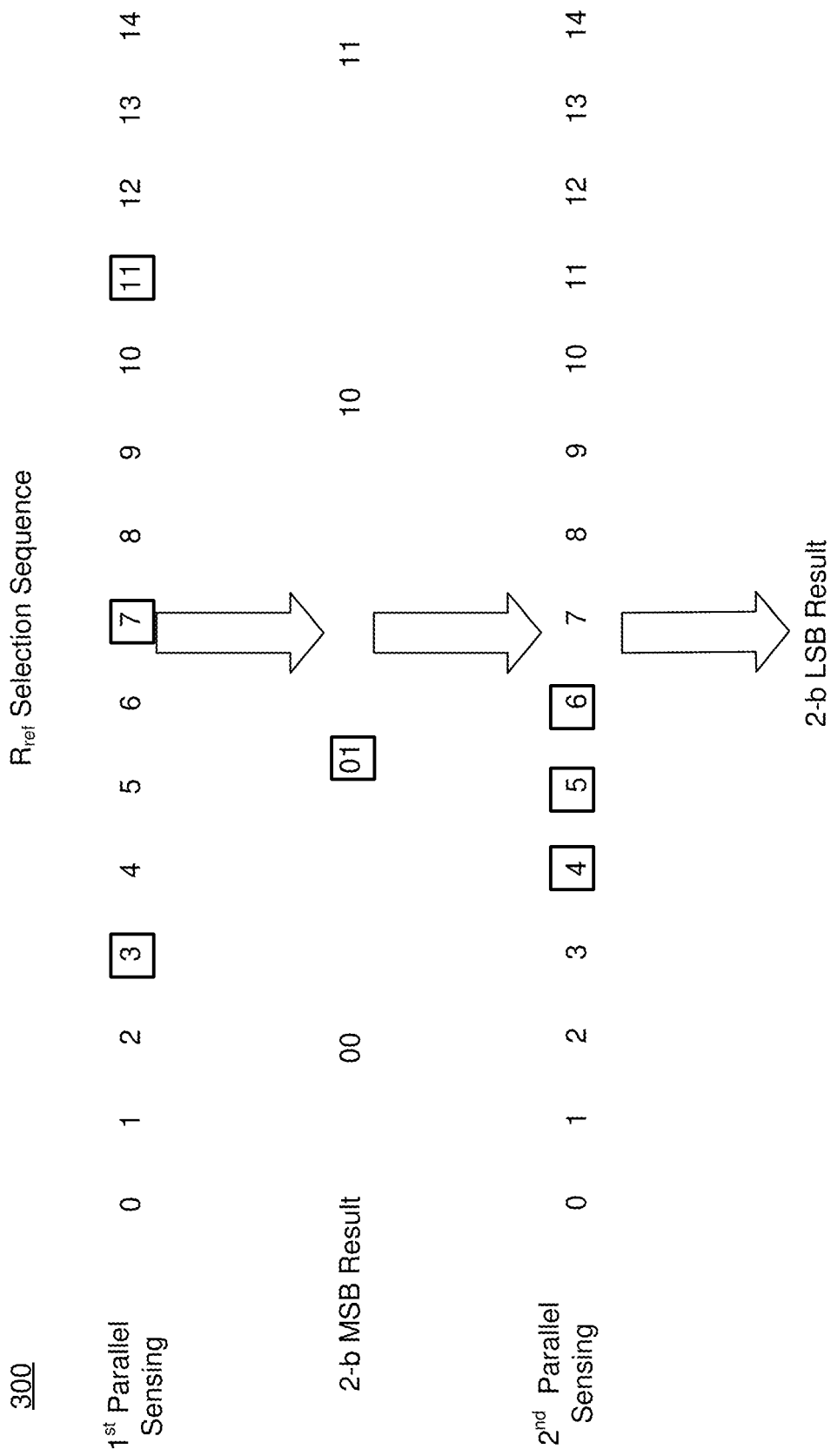
FIG. 3 is an example timing diagram of performing a series of parallel sensing operations, in accordance with some embodiments.

FIG. 3 is an example timing diagram 300 of performing parallel sensing and serial sensing, in accordance with some embodiments. Assuming for an example that a MLC 125 can have one of 16 predetermined resistance states to represent 4 bit data. In one approach, to read stored data from the MLC 125, the MLC 125 can perform a series of parallel sensing operations.

For the first parallel sensing operation, in one approach, the sense controller 210 configures the multiplexers 220A, 220B, 220C to select predetermined reference circuits 250AA, 250BA, 250CA having reference resistances $3^{rd}$ $R_{ref}$, $7^{th}$ $R_{ref}$ and $11^{th}$ $R_{ref}$. In one example, the reference resistances $3^{rd}$ $R_{ref}$, 7th $R_{ref}$, $11^{th}$ $R_{ref}$ are predetermined or assigned for determining first two bits of multiple bits of data stored (e.g., [YY] of [YYXX]). During a first time period, the multiplexer 220A can electrically couple the reference circuit 250AA to the sense amplifier 240A, the multiplexer 220B can electrically couple the reference circuit 250BA to the sense amplifier 240B, and the multiplexer 220C can electrically couple the reference circuit 250CA to the sense amplifier 240C simultaneously. The sense amplifiers 240A, 240B, 240C can compare characteristic (e.g., voltage or discharge rate) of the MLC 125 with characteristics of the reference circuits 250AA, 250BA, 250CA, and output the comparisons, for example, in a thermometer code. For example, if the discharge rate of the MLC 125 is higher than a discharge rate of the reference circuit 250AA but less than discharge rates of the reference circuits 250BA, 250CA, the sense amplifiers 240A, 240B, 240C can output [100], because the resistance of the MLC 125 is determined to be greater than the reference resistance $3^{rd}$ $R_{ref}$ but less than the reference resistances $7^{th}$ $R_{ref}$, $11^{th}$ $R_{ref}$. The sense controller 210 can receive outputs from the sense amplifiers 240A, 240B, 240C, and decode the outputs in the thermometer code into 2 bit binary representation, which may correspond to MSBs of data stored by the MLC 125. For example, the thermometer code [100] having one '1' can be converted into a binary representation [01].

For the second parallel sensing operation, in one approach, the sense controller 210 selects, for each multiplexer, a corresponding reference circuit according to the one or more determined bits in the first parallel sensing operation. Assuming for an example that [01] is determined from the first parallel sensing operation, the sense controller 210 configures the multiplexers 220A, 220B, 220C to select reference circuits 250AC, 250BC, 250CC corresponding to the determined bits [01]. The reference circuits 250AC, 250BC, 250CC may have reference resistances $4^{th}$ $R_{ref}$, $5^{th}$ $R_{ref}$ and $6^{th}$ $R_{ref}$ respectively. The sense amplifiers 240A, 240B, 240C can compare characteristic (e.g., voltage or discharge rate) of the MLC 125 with characteristics of the reference circuits 250AC, 250BC, 250CC, and output the comparisons, for example, in a thermometer code. For example, if the discharge rate of the MLC 125 is higher than a discharge rate of the reference circuits 250AC, 250BC, but less than discharge rates of the reference circuit 250CC, the sense amplifiers 240A, 240B, 240C can output [110]. The sense controller 210 can receive outputs from the sense amplifiers 240A, 240B, 240C, and decode the outputs in the thermometer code into a 2 bit binary representation, which may correspond to LSBs of data stored by the MLC 125. For example, the thermometer code [110] having two '1' can be converted to binary representation [10].

FIG. 4 is a flowchart of a method 400 of reading multiple bits of data stored by a multi-level cell, in accordance with some embodiments. The method 400 may be performed by the sensing device 205 of FIG. 2. In some embodiments, the method 400 is performed by other entities. In some embodiments, the method 400 includes more, fewer, or different operations than shown in FIG. 4.

In an operation 410, the sensing device 205 performs a first parallel sensing operation through sense amplifiers (e.g., 240A-240C) with reference circuits (e.g., 250AA, 250BA, 250CA) during a first time period. In one approach, the sense amplifiers (e.g., 240A-240C) simultaneously compares a characteristic (e.g., a resistance, a discharge rate, a voltage, etc.) of a memory cell (e.g., MLC 125) with characteristics of the reference circuits (e.g., 250AA, 250BA, 250CA) during the first time period, and determine a value (or values) of one or more bits (e.g., MSBs) of multiple bits of data stored by the memory cell (e.g., MLC 125).

In one approach, the operation 410 includes operations 412, 414. In the operation 412, a sense controller (e.g., 210) selects reference circuits (e.g., 250AA, 250BA, 250CA) from a set of reference circuits (e.g., 250AA-250AE, 250BA-250BE, 250CA-250CE). In one aspect, each subset of the set of reference circuits 250 is associated with a corresponding one of multiplexers (e.g., 220A, 220B, 220C). For example, the reference circuits 250AA-250AE are associated with the multiplexer 220A, the reference circuits 250BA-250BE are associated with the multiplexer 220B, and the reference circuits 250CA-250CE are associated with the multiplexer 220C. In the operation 412, the sense controller (e.g., 210) may select, from each of the subsets of the set of reference circuits 250, predetermined reference circuits (e.g., 250AA, 250BA, 250CA). The sense controller (e.g., 210) may generate one or more control signals to configure the multiplexers 220A-220C to electrically couple the selected reference circuits (e.g., 250AA, 250BA, 250CA) to the corresponding sense amplifiers 240A-240C, respectively, during the first time period.

In an operation 414, the sense controller (e.g., 210) determines a value (or values) of one or more bits (e.g., MSBs) of the multiple bits of data stored by the memory cell (e.g., MLC 125) according to the reference circuits (e.g., 250AA, 250BA, 250CA). In one approach, the multiplexers 220A-220C can electrically couple the selected reference circuits (e.g., 250AA, 250BA, 250CA) to the sense amplifiers (e.g., 240A-240C), respectively, according to the control signal from the sense controller (e.g., 210). The sense amplifiers (e.g., 240A-240C) can compare a characteristic (e.g., a resistance, a discharge rate, a voltage, etc.) of the memory cell (e.g., MLC 125) with characteristics of the reference circuits (e.g., 250AA, 250BA, 250CA), and generate outputs according to the comparisons during the first time period. In one example, the outputs of the sense amplifiers (e.g., 240A-240C) are represented in a thermometer code. The sense controller (e.g., 210) may receive the outputs of the sense amplifiers (e.g., 240A-240C) in the thermometer code, and convert the received outputs into a binary representation. For example, if the outputs OutA, OutB, OutC are [110] in a thermometer code, the sense controller (e.g., 210) may determine that a discharge rate of the MLC 125 is higher than discharge rates of the reference circuits 250AA, 250BA but less than the discharge rate of the reference circuit 250CA. Accordingly, the sense controller 210 may determine that first two MSBs of the MLC 125 is [10] in a binary code corresponding to the thermometer code [110] having two '1'.

In an operation 430, the sensing device 205 performs a second parallel sensing operation though the sense amplifiers (e.g., 240A-240C) with different reference circuits (e.g., 250AD, 250BD, 250CD) during a second time period. In one approach, different reference circuits (e.g., 250) are selected according to the value (or the values) of the one or more bits determined in the operation 410. The sense amplifiers (e.g., 240A-240C) can simultaneously compare the characteristic (e.g., a resistance, a discharge rate, a voltage, etc.) of the memory cell (e.g., MLC 125) with characteristics of the different reference circuits (e.g., 250AA, 250BA, 250CA) during the second time period, and determine one or more bits (e.g., LSBs) of the multiple bits of data stored by the memory cell (e.g., MLC 125).

In one approach, the operation 430 includes operations 432, 434. In the operation 432, the sense controller (e.g., 210) selects different reference circuits (e.g., 250AD, 250BD, 250CD) from a set of reference circuits (e.g., 250AA-250AE, 250BA-250BE, 250CA-250CE), according to the determined one or more bits in the operation 410. For example, the reference circuits 250AB, 250BB, 250CB having resistances $0^{th}$ $R_{ref}$, $1^{st}$ $R_{ref}$, $2^{nd}$ $R_{ref}$ respectively, correspond to [00] of two bits determined during the prior sensing; the reference circuits 250AC, 250BC, 250CC having resistances $4^{th}$ $R_{ref}$, $5^{th}$ $R_{ref}$, $6^{th}$ $R_{ref}$ respectively, correspond to [01] of two bits determined during the prior sensing; the reference circuits 250AD, 250BD, 250CD having resistances $8^{th}$ $R_{ref}$, $9^{th}$ $R_{ref}$, $10^{th}$ $R_{ref}$ respectively, correspond to [10] of two bits determined during the prior sensing; and the reference circuits 250AE, 250BE, 250CE having resistances $12^{th}$ $R_{ref}$, $13^{th}$ $R_{ref}$, $14^{th}$ $R_{ref}$ respectively, correspond to [11] of two bits determined during the prior sensing. Assuming for an example that two bits determined in the operation 410 is [10], the sense controller 210 selects the reference circuits 250AD, 250BD, 250CD.

In the operation 434, the sense controller (e.g., 210) determines additional one or more bits of the multiple bits of data stored by the memory cell according to the different reference circuits. In one approach, the multiplexers 220A-220C can electrically couple the reference circuits (e.g., 250AD, 250BD, 250CD) selected in the operation 432 to the sense amplifiers (e.g., 240A-240C), respectively. The sense amplifiers (e.g., 240A-240C) can compare the characteristic (e.g., a resistance, a discharge rate, a voltage, etc.) of the memory cell (e.g., MLC 125) with characteristics of the reference circuits (e.g., 250AD, 250BD, 250CD), and generate outputs according to the comparisons during the second time period. The sense controller (e.g., 210) may receive the outputs of the sense amplifiers (e.g., 240A-240C) in the thermometer code, and convert the received outputs into the binary representation. In one aspect, the one or more bits determined in the operation 434 corresponds to LSB of the multiple bits of data stored by the memory cell (e.g., MLC 125).

Advantageously, the series of parallel sensing operations disclosed herein allows sensing multiple bits of data stored by a MLC 125 in an area and time efficient manner. For example, serial sensing through a single sense amplifier allows reduction in an area of the integrated circuit, but may take a long time. Meanwhile, parallel sensing through multiple sense amplifiers allows sensing in a time efficient manner, but multiple sense amplifiers may consume a large area of the integrated circuit. By determining one or more bits (e.g., MSBs) of multiple bits of data stored by the MLC through a first parallel sensing operation and one or more bits (e.g., LSBs) of the multiples bits of data stored by the MLC 125 through a second parallel sensing operation based on the first parallel sensing operation, less number of comparators can be implemented compared to a number of comparators for performing a single parallel sensing operation. Moreover, a speed of comparison can be improved compared to a speed of comparison for performing a serial sensing operation. Hence, multiple bits of data stored by the MLC can be read in an area and time efficient manner.

Figure 5:
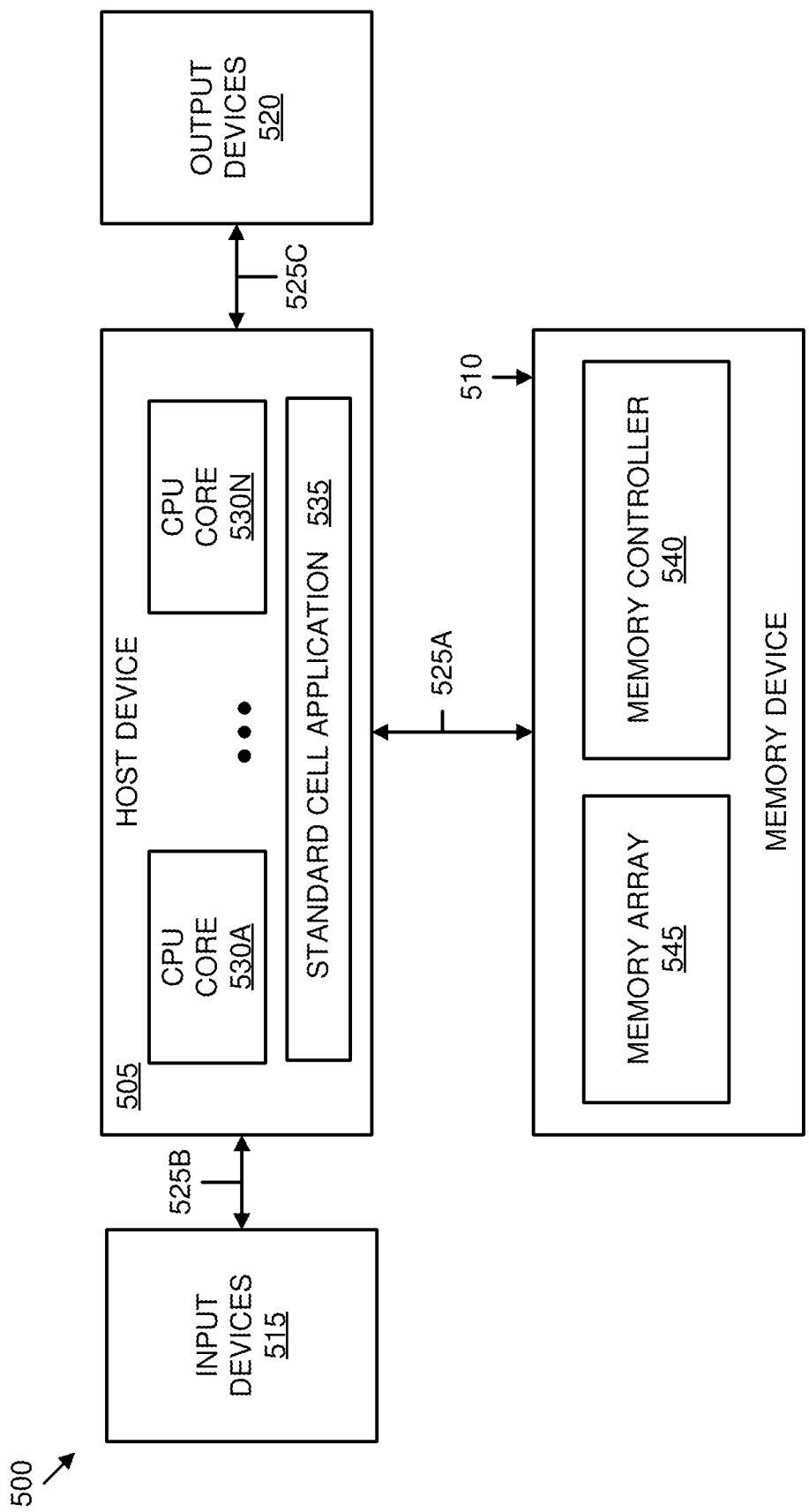
FIG. 5 is an example block diagram of a computing system, in accordance with some embodiments.

Referring now to FIG. 5, an example block diagram of a computing system 500 is shown, in accordance with some embodiments of the disclosure. The computing system 500 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 500 includes a host device 505 associated with a memory device 510. The host device 505 may be configured to receive input from one or more input devices 515 and provide output to one or more output devices 520. The host device 505 may be configured to communicate with the memory device 510, the input devices 515, and the output devices 520 via appropriate interfaces 525A, 525B, and 525C, respectively. The computing system 500 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 505.

The input devices 515 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 505 and that allows an external source, such as a user (e.g., a circuit or layout designer), to enter information (e.g., data) into the host device and send instructions to the host device. Similarly, the output devices 520 may include a variety of output technologies such as external memories, printers, speakers, displays, microphones, light emitting diodes, headphones, video devices, and any other output peripherals that are configured to receive information (e.g., data) from the host device 505. The "data" that is either input into the host device 505 and/or output from the host device may include any of a variety of textual data, circuit data, signal data, semiconductor device data, graphical data, combinations thereof, or other types of analog and/or digital data that is suitable for processing using the computing system 500.

The host device 505 includes or is associated with one or more processing units/processors, such as Central Processing Unit ("CPU") cores 530A-530N. The CPU cores 530A-530N may be implemented as an Application Specific Integrated Circuit ("ASIC"), Field Programmable Gate Array ("FPGA"), or any other type of processing unit. Each of the CPU cores 530A-530N may be configured to execute instructions for running one or more applications of the host device 505. In some embodiments, the instructions and data to run the one or more applications may be stored within the memory device 510. The host device 505 may also be configured to store the results of running the one or more applications within the memory device 510. Thus, the host device 505 may be configured to request the memory device 510 to perform a variety of operations. For example, the host device 505 may request the memory device 510 to read data, write data, update or delete data, and/or perform management or other operations. One such application that the host device 505 may be configured to run may be a standard cell application 535. The standard cell application 535 may be part of a computer aided design or electronic design automation software suite that may be used by a user of the host device 505 to use, create, or modify a standard cell of a circuit. In some embodiments, the instructions to execute or run the standard cell application 535 may be stored within the memory device 510. The standard cell application 535 may be executed by one or more of the CPU cores 530A-530N using the instructions associated with the standard cell application from the memory device 510. In one example, the standard cell application 535 allows a user to utilize pre-generated schematic and/or layout designs of the memory device 100 or a portion of the memory device 100 to aid integrated circuit design. After the layout design of the integrated circuit is complete, multiples of the integrated circuit, for example, including the memory device 100 or a portion of the memory device 100 can be fabricated according to the layout design by a fabrication facility.

Referring still to FIG. 5, the memory device 510 includes a memory controller 540 that is configured to read data from or write data to a memory array 545. The memory array 545 may include a variety of volatile and/or non-volatile memories. For example, in some embodiments, the memory array 545 may include NAND flash memory cores. In other embodiments, the memory array 545 may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 545 may be individually and independently controlled by the memory controller 540. In other words, the memory controller 540 may be configured to communicate with each memory within the memory array 545 individually and independently. By communicating with the memory array 545, the memory controller 540 may be configured to read data from or write data to the memory array in response to instructions received from the host device 505. Although shown as being part of the memory device 510, in some embodiments, the memory controller 540 may be part of the host device 505 or part of another component of the computing system 500 and associated with the memory device. The memory controller 540 may be implemented as a logic circuit in either software, hardware, firmware, or combination thereof to perform the functions described herein. For example, in some embodiments, the memory controller 540 may be configured to retrieve the instructions associated with the standard cell application 535 stored in the memory array 545 of the memory device 510 upon receiving a request from the host device 505.

It is to be understood that only some components of the computing system 500 are shown and described in FIG. 5. However, the computing system 500 may include other components such as various batteries and power sources, networking interfaces, routers, switches, external memory systems, controllers, etc. Generally speaking, the computing system 500 may include any of a variety of hardware, software, and/or firmware components that are needed or considered desirable in performing the functions described herein. Similarly, the host device 505, the input devices 515, the output devices 520, and the memory device 510 including the memory controller 540 and the memory array 545 may include other hardware, software, and/or firmware components that are considered necessary or desirable in performing the functions described herein.

One aspect of this description relates to a memory device. In some embodiments, the memory device includes a multi-level cell storing multiple bits of data. In some embodiments, the memory device includes a sensing device coupled to the multi-level cell. In some embodiments, the sensing device includes a first sense amplifier having a first input port coupled to the multi-level cell. In some embodiments, the sensing device includes a first multiplexer coupled to a second input port of the first sense amplifier. In some embodiments, the sensing device includes a second sense amplifier having a first input port coupled to the multi-level cell. In some embodiments, the method sensing device includes a second multiplexer coupled to a second input port of the second sense amplifier.

One aspect of this description relates to a memory device. In some embodiments, the memory device includes a multi-level cell storing multiple bits of data. In some embodiments, the memory device includes a sensing device coupled to the multi-level cell. In some embodiments, the sensing device includes a set of sense amplifiers, each of the set of sense amplifiers including a first input port and a second input port, the first input port coupled to the multi-level cell. In some embodiments, the sensing device includes a set of reference circuits, and a set of multiplexers. Each of the set of multiplexers may be coupled between the second input port of a corresponding one of the set of sense amplifiers and a corresponding subset of the set of reference circuits.

One aspect of this description relates to a method of reading data stored by a multi-level cell. In some embodiments, the method includes selecting, a first reference circuit from a first set of reference circuits. In some embodiments, the method includes selecting a second reference circuit from a second set of reference circuits. In some embodiments, the method includes determining one or more bits of multiple bits of data stored by a multi-level cell, based at least in part on the first reference circuit and the second reference circuit. In some embodiments, the method includes selecting a third reference circuit from the first set of reference circuits, according to the determined one or more bits. In some embodiments, the method includes selecting a fourth reference circuit from the second set of reference circuits, according to the determined one or more bits. In some embodiments, the method includes determining additional one or more bits of the multiple bits of data stored by the multi-level cell, based at least in part on the third reference circuit and the fourth reference circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
   a multi-level cell to store multiple bits of data; and
   a sensing device including:
      a first multiplexer to select one of a first set of reference circuits,
      a second multiplexer to select one of a second set of reference circuits,
      a first sense amplifier to compare a first voltage of the multi-level cell with a second voltage of the one of the first set of reference circuits to obtain a first comparison,
      a second sense amplifier to compare the first voltage of the multi-level cell with a third voltage of the one of the second set of reference circuits to obtain a second comparison, and
      a sense controller to determine one or more bits of the multiple bits of data stored by the multi-level cell, according to the first comparison and the second comparison.

2. The memory device of claim 1, wherein the sense controller is to:
   configure the first multiplexer to select another one of the first set of reference circuits, according to the one or more bits of the multiple bits of data; and
   configure the second multiplexer to select another one of the second set of reference circuits, according to the one or more bits of the multiple bits of data.

3. The memory device of claim 1,
   wherein the first multiplexer is to electrically couple the one of the first set of reference circuits to an input port of the first sense amplifier during a first time period, and
   wherein the second multiplexer is to electrically couple the one of the second set of reference circuits to an input port of the second sense amplifier during the first time period.

4. The memory device of claim 3,
   wherein the first multiplexer is to electrically couple another one of the first set of reference circuits to the input port of the first sense amplifier during a second time period, and
   wherein the second multiplexer is to electrically couple the another one of the second set of reference circuits to the input port of the second sense amplifier during the second time period.

5. The memory device of claim 4,
   wherein the first sense amplifier is to compare a characteristic of the multi-level cell with a first reference characteristic of the one of the first set of reference circuits to obtain the first comparison during the first time period, and
   wherein the second sense amplifier is to compare the characteristic of the multi-level cell with a second reference characteristic of the one of the second set of reference circuits to obtain the second comparison during the first time period.

6. The memory device of claim 5, wherein the sense controller is to determine the one or more bits of the multiple bits of data stored by the multi-level cell, according to the first comparison and the second comparison during the first time period.

7. The memory device of claim 5,
   wherein the first sense amplifier is to compare the characteristic of the multi-level cell with a third reference characteristic of the another one of the first set of reference circuits to obtain a third comparison during the second time period, and
   wherein the second sense amplifier is to compare the characteristic of the multi-level cell with a fourth reference characteristic of the another one of the second set of reference circuits to obtain a fourth comparison during the second time period.

8. The memory device of claim 7, wherein the sense controller is to determine additional one or more bits of the multiple bits of data stored by the multi-level cell, according to the third comparison and the fourth comparison during the second time period.

9. A memory device comprising:
a multi-level cell to store multiple bits of data; and
a sensing device including:
  a set of reference circuits,
  a set of multiplexers, each of the set of multiplexers to select a reference circuit from a corresponding subset of the set of reference circuits,
  a set of sense amplifiers, each of the set of sense amplifiers to compare an input voltage of the multi-level cell with a voltage of the reference circuit selected by a corresponding multiplexer of the set of multiplexers, and
  a sense controller to determine one or more bits of the multiple bits of data stored by the multi-level cell, according to the comparisons by the set of sense amplifiers.

10. The memory device of claim 9, wherein the sense controller is to:
configure the each of the set of multiplexers to select the reference circuit from the corresponding subset of the set of reference circuits during a first time period.

11. The memory device of claim 10, wherein the each of the sense amplifiers is to compare the input voltage of the multi-level cell with the voltage of the reference circuit selected by the corresponding multiplexer of the set of multiplexers during the first time period.

12. The memory device of claim 10, wherein the sense controller is to:
configure the each of the set of multiplexers to select another reference circuit from the corresponding subset during a second time period, according to the one or more bits of the multiple bits of data.

13. The memory device of claim 12, wherein the each of the sense amplifiers to is to compare the input voltage of the multi-level cell with a voltage of the another reference circuit selected by the corresponding multiplexer of the set of multiplexers during the second time period.

14. The memory device of claim 13, wherein the sense controller is to:
determine additional one or more bits of the multiple bits of data stored by the multi-level cell, according to the comparisons by the set of sense amplifiers during the second time period.

15. The memory device of claim 9, wherein the each of the set of multiplexers is to electrically couple the selected reference circuit from the corresponding subset of the set of reference circuits to an input port of a corresponding sense amplifier of the set of sense amplifiers during a first time period.

16. The memory device of claim 15, wherein the each of the set of multiplexers is to electrically couple another selected reference circuit from the corresponding subset of the set of reference circuits to the input port of the corresponding sense amplifier of the set of sense amplifiers during a second time period, according to the one or more bits of the multiple bits of data.

17. The memory device of claim 15, wherein the each of the set of sense amplifiers includes another input port coupled to the multi-level cell.

18. A memory device comprising:
a sense controller to:
  select a first reference circuit from a first set of reference circuits,
  select a second reference circuit from a second set of reference circuits,
  determine one or more bits of multiple bits of data stored by a multi-level cell, based at least in part on the first reference circuit and the second reference circuit,
  select a third reference circuit from the first set of reference circuits, according to the determined one or more bits,
  select a fourth reference circuit from the second set of reference circuits, according to the determined one or more bits, and
  determine additional one or more bits of the multiple bits of data stored by the multi-level cell, based at least in part on the third reference circuit and the fourth reference circuit.

19. The memory device of claim 18, further comprising:
a first sense amplifier to compare a characteristic of the multi-level cell with a first reference characteristic of the first reference circuit during a first time period; and
a second sense amplifier to compare the characteristic of the multi-level cell with a second reference characteristic of the second reference circuit during the first time period,
wherein the sense controller is to determine the one or more bits of the multiple bits of data stored by the multi-level cell, based at least in part on the comparisons during the first time period.

20. The memory device of claim 19,
wherein the first sense amplifier is to compare the characteristic of the multi-level cell with a third reference characteristic of the third reference circuit during a second time period,
wherein the second sense amplifier is to compare the characteristic of the multi-level cell with a fourth reference characteristic of the fourth reference circuit during the second time period, and
wherein the sense controller is to determine the additional one or more bits of the multiple bits of data stored by the multi-level cell, based at least in part on the comparisons during the second time period.

\* \* \* \* \*